United States Patent
Ingalls et al.

(10) Patent No.: US 10,115,438 B2
(45) Date of Patent: Oct. 30, 2018

(54) SENSE AMPLIFIER CONSTRUCTIONS

(71) Applicant: Micron Technology, Inc., Boise, ID (US)

(72) Inventors: Charles L. Ingalls, Meridian, ID (US); Scott J. Derner, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/667,234

(22) Filed: Aug. 2, 2017

(65) Prior Publication Data
US 2018/0061460 A1 Mar. 1, 2018

Related U.S. Application Data

(60) Provisional application No. 62/381,745, filed on Aug. 31, 2016.

(51) Int. Cl.
*G11C 7/06* (2006.01)
*G11C 7/22* (2006.01)

(52) U.S. Cl.
CPC ................... *G11C 7/065* (2013.01)

(58) Field of Classification Search
CPC combination set(s) only.
See application file for complete search history.

(56) References Cited

U.S. PATENT DOCUMENTS

| | | |
|---|---|---|
| 4,103,342 A | 7/1978 | Miersch et al. |
| 5,299,155 A | 3/1994 | Yanagi |
| 5,389,810 A | 2/1995 | Agata |
| 5,571,743 A | 11/1996 | Henkels et al. |
| 5,646,900 A | 7/1997 | Tsukude et al. |
| 6,563,727 B1 | 5/2003 | Roth et al. |
| 6,720,609 B2 | 4/2004 | Deboer et al. |
| 6,744,087 B2 | 6/2004 | Misewich |
| 6,961,271 B2 | 11/2005 | Jeon et al. |
| 7,330,388 B1 | 2/2008 | Chapman et al. |

(Continued)

FOREIGN PATENT DOCUMENTS

| | | |
|---|---|---|
| JP | 2003-303901 | 10/2003 |
| JP | 2011-142256 | 7/2011 |

(Continued)

OTHER PUBLICATIONS

Chun et al.; "A 3T Gain Cell Embedded DRAM Utilizing Preferential Boosting for High Density and Low Power On-Die Caches"; IEEE Journal of Solid-State Circuits; vol. 46, No. 6, Jun. 2011; pp. 1495-1505.

(Continued)

*Primary Examiner* — An Luu
(74) *Attorney, Agent, or Firm* — Wells St. John P.S.

(57) ABSTRACT

A sense amplifier construction comprises a first n-type transistor and a second n-type transistor above the first n-type transistor. A third p-type transistor is included and a fourth p-type transistor is above the third p-type transistor. A lower voltage activation line is electrically coupled to n-type source/drain regions that are elevationally between respective gates of the first and second n-type transistors. A higher voltage activation line is electrically coupled to p-type source/drain regions that are elevationally between respective gates of the third and fourth p-type transistors.

18 Claims, 6 Drawing Sheets

(56) References Cited

U.S. PATENT DOCUMENTS

| | | | |
|---|---|---|---|
| 7,378,702 B2 | 5/2008 | Lee | |
| 7,558,097 B2 | 7/2009 | Khellah et al. | |
| 7,697,318 B2 | 4/2010 | Fukuda et al. | |
| 8,212,311 B2 * | 7/2012 | Masuoka | H01L 21/823828 257/329 |
| 9,343,507 B2 | 5/2016 | Takaki | |
| 9,378,780 B1 * | 6/2016 | Chang | G11C 7/08 |
| 2001/0053088 A1 | 12/2001 | Forbes | |
| 2003/0087499 A1 | 5/2003 | Lane et al. | |
| 2003/0169616 A1 | 9/2003 | Noro | |
| 2003/0173593 A1 | 9/2003 | Miyatake | |
| 2003/0202391 A1 | 10/2003 | Nishimura et al. | |
| 2003/0234413 A1 | 12/2003 | Sberno et al. | |
| 2004/0062101 A1 | 4/2004 | Kasuga | |
| 2004/0151020 A1 | 8/2004 | Beer | |
| 2004/0174733 A1 | 9/2004 | Kirihata et al. | |
| 2004/0232497 A1 | 11/2004 | Akiyama | |
| 2004/0252542 A1 | 12/2004 | Hoya et al. | |
| 2006/0028859 A1 | 2/2006 | Forbes | |
| 2006/0211194 A1 | 9/2006 | Haller | |
| 2007/0034928 A1 | 2/2007 | Cook et al. | |
| 2007/0161179 A1 | 7/2007 | Lee | |
| 2007/0295995 A1 | 12/2007 | Yun | |
| 2009/0008691 A1 | 1/2009 | Lee et al. | |
| 2009/0108881 A1 | 4/2009 | Wilson | |
| 2009/0168489 A1 | 7/2009 | Madan et al. | |
| 2010/0238697 A1 | 9/2010 | Juengling | |
| 2010/0264484 A1 | 10/2010 | Masuoka et al. | |
| 2010/0295110 A1 | 11/2010 | Takaishi | |
| 2012/0153371 A1 | 6/2012 | Chen et al. | |
| 2013/0161607 A1 | 6/2013 | Yoneda | |
| 2013/0221356 A1 | 8/2013 | Yamazaki | |
| 2013/0235641 A1 | 9/2013 | Iwaki | |
| 2013/0235642 A1 | 9/2013 | Heineck et al. | |
| 2014/0035018 A1 | 2/2014 | Lee | |
| 2014/0220749 A1 | 8/2014 | Rutter | |
| 2015/0041885 A1 | 2/2015 | Yoshida et al. | |
| 2015/0318285 A1 | 11/2015 | Zhang | |
| 2016/0071843 A1 | 3/2016 | Kadoya | |
| 2016/0079247 A1 | 3/2016 | Lim et al. | |
| 2018/0061835 A1 | 3/2018 | Yang et al. | |

FOREIGN PATENT DOCUMENTS

| | | |
|---|---|---|
| KR | 10-2007-0070021 | 7/2007 |
| KR | 10-2016-0032559 | 3/2016 |
| WO | PCT/2017/045052 | 11/2017 |
| WO | PCT/US2017/044611 | 11/2017 |
| WO | PCT/US2017/044633 | 11/2017 |
| WO | PCT/US2017/044638 | 11/2017 |
| WO | PCT/US2017/044653 | 11/2017 |
| WO | PCT/US2017/044661 | 11/2017 |

OTHER PUBLICATIONS

Henkels et al.; "Large-Signal 2T, 1C DRAM Cell: Signal and Layout Analysis"; IEEE Journal of Solid-State Circuits; vol. 29, No. 7; Jul. 1994; pp. 829-832.

* cited by examiner

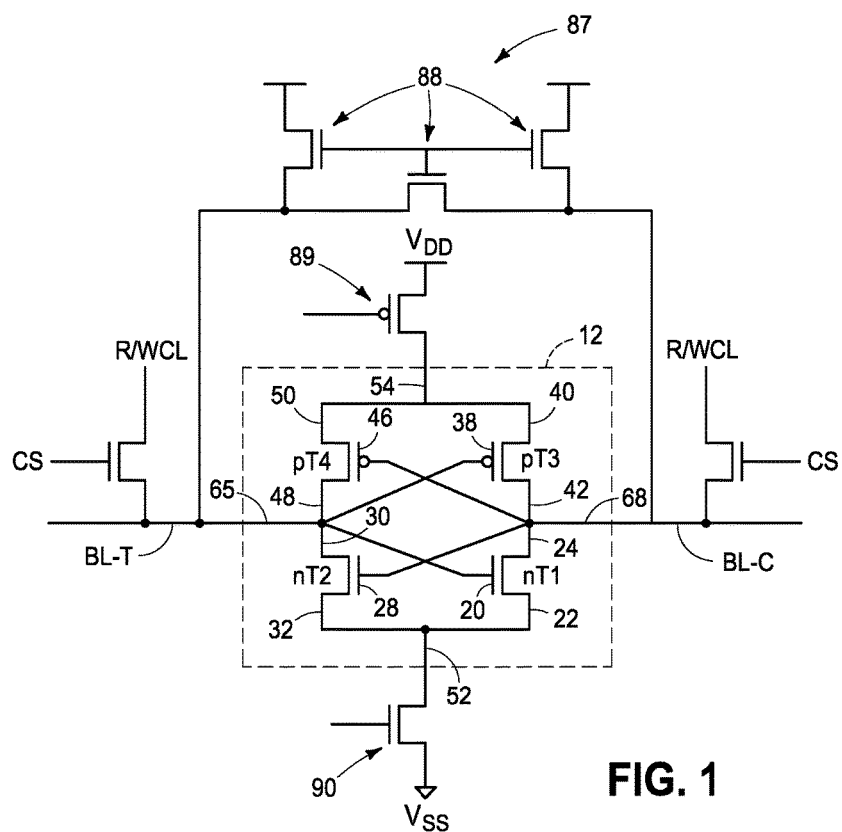
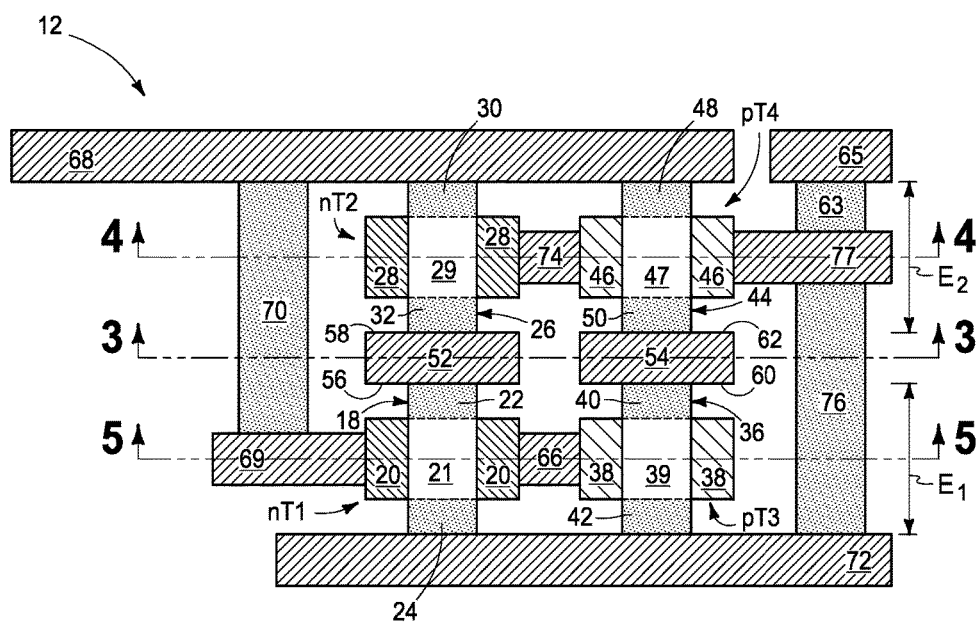
FIG. 1
FIG. 2

SENSE AMPLIFIER CONSTRUCTIONS

RELATED PATENT DATA

This patent claims priority to U.S. Provisional Patent Application Ser. No. 62/381,745, which was filed Aug. 31, 2016.

TECHNICAL FIELD

Embodiments disclosed herein pertain to sense amplifiers.

BACKGROUND

Memory is one type of integrated circuitry, and is used in computer systems for storing data. Memory may be fabricated in one or more arrays of individual memory cells. Memory cells may be written to, or read from, using bit lines (which may also be referred to as digit lines, data lines, sense lines, or data/sense lines) and access lines (which may also be referred to as word lines). The bit lines may conductively interconnect memory cells along columns of the array, and the access lines may conductively interconnect memory cells along rows of the array. Each memory cell may be uniquely addressed through the combination of a bit line and an access line.

Memory cells may be volatile or non-volatile. Non-volatile memory cells can store data for extended periods of time including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example reversibly programmable charge storage/trap regions as part of the gate construction between the gate insulator and the conductive gate.

One electronic component associated with a memory cell is a sense amplifier. These devices are typically electrically coupled with one or more bit lines of a column of memory cells within an array. The sense amplifier at least in part is used to detect what value is stored in a memory cell and reporting that value amplified at an output of the sense amplifier.

BRIEF DESCRIPTION OF THE DRAWINGS

FIG. 1 is a non-structural diagrammatic schematic showing a sense amplifier construction in accordance with an embodiment of the invention.

FIG. 2 is a diagrammatic vertical section view of a sense amplifier construction in accordance with part of the FIG. 1 schematic and an embodiment of the invention.

DETAILED DESCRIPTION OF EXAMPLE EMBODIMENTS

Figure 3:
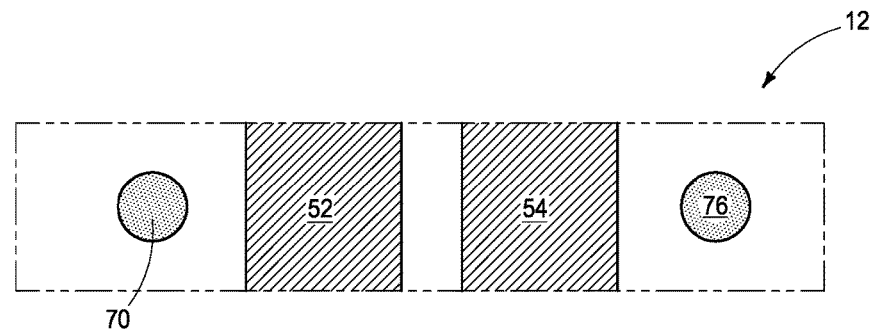
FIG. 3 is a cross-sectional view taken through line 3-3 in FIG. 2.
Figure 4:
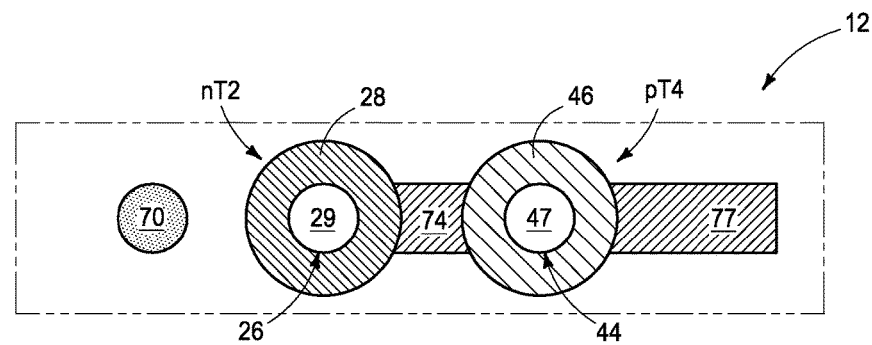
FIG. 4 is a cross-sectional view taken through line 4-4 in FIG. 2.
Figure 5:
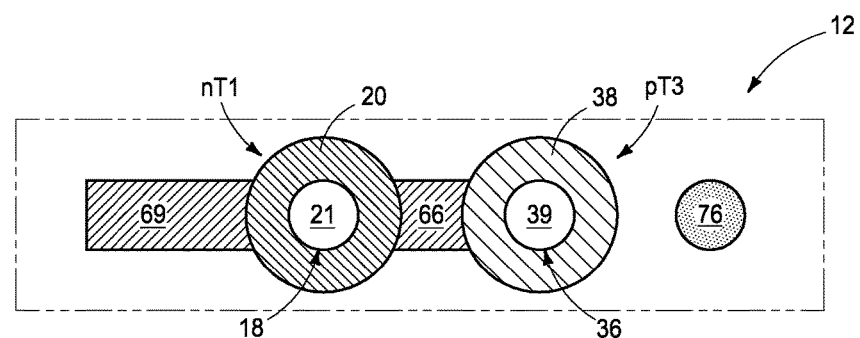
FIG. 5 is a cross-sectional view taken through line 5-5 in FIG. 2.

First example embodiments of a sense amplifier construction in accordance with the invention are described with reference to FIGS. 1-5. FIG. 1 is a diagrammatic schematic showing an example sense amplifier 12 essentially in the absence of structure, whereas FIGS. 2-5 show a specific example sense amplifier construction 12. Circuitry components associated with sense amplifier 12 are shown schematically there-about in FIG. 1 as described more below. Example sense amplifier construction 12 shown in FIGS. 1-5 is a latch-based sense amplifier, and more specifically a latched voltage sense amplifier. However, alternate sense amplifiers are contemplated in accordance with the invention, also as described more below.

Construction 12 comprises a first n-type transistor nT1 and a second n-type transistor nT2 extending elevationally outward of first n-type transistor nT1. In this document, unless otherwise indicated, "elevational(ly)", "higher", "upper", "lower", "top", "atop", "bottom", "above", "below", "under", "beneath", "up", and "down" are generally with reference to the vertical direction. Further, "vertical" and "horizontal" as used herein are generally perpendicular directions relative one another independent of orientation of the substrate in three dimensional space. Also, "extending elevationally" in this document encompasses a range from vertical to no more than 45° from vertical. Construction 12 would be above a base substrate (not shown). The base substrate may include any one or more of conductive/conductor/conducting (i.e., electrically herein), semiconductive, or insulative/insulator/insulating (i.e., electrically herein) materials.

First transistor nT1 comprises a first semiconductor material pillar 18 extending along a first gate 20 and comprises a first channel region 21 elevationally between a first transistor top n-type source/drain region 22 and a first transistor bottom n-type source/drain region 24. Gate insulator (not shown) would be between each channel region and each gate of each transistor in the Figures but is not shown for simplicity and better clarity in the Figures. Second transistor nT2 comprises a second semiconductor material pillar 26 extending along a second gate 28 and comprises a second channel region 29 elevationally between a second transistor top n-type source/drain region 30 and a second transistor bottom n-type source/drain region 32. Each of first and second semiconductor material pillars 18 and 26 is shown as being circular in horizontal cross-section, although any alternate shape(s) may be used, and pillars 18 and 26 need not be of the same horizontal cross-sectional shape. In one embodiment, second semiconductor material pillar 26 is directly above first semiconductor material pillar 18. In this document, "directly above" requires at least some lateral overlap (i.e., horizontally) of the first and second semiconductor material pillars relative one another. Further, use of "above" not preceded by "directly" only requires that some portion of the second semiconductor material pillar be elevationally outward of the first semiconductor material pillar (i.e., independent of whether there is any lateral overlap of the two pillars). In one embodiment and as shown, first semiconductor material pillar 18 and second semiconductor material pillar 26 are longitudinally coaxial. In the depicted FIG. 2 embodiment, semiconductor material pillars 18 and 26 are shown as being of identical height and width, although need not be so.

Construction 12 includes a third p-type transistor pT3 and a fourth p-type transistor pT4 extending elevationally outward relative to third p-type transistor pT3. Third transistor pT3 comprises a third semiconductor material pillar 36 extending along a third gate 38 and comprises a third channel region 39 elevationally between a third transistor top p-type source/drain region 40 and a third transistor bottom p-type source/drain region 42. Fourth transistor pT4 comprises a fourth semiconductor material pillar 44 extending along a fourth gate 46 and comprises a fourth channel region 47 elevationally between a fourth transistor top p-type source/drain region 48 and a fourth transistor bottom p-type source/drain region 50. In one embodiment, fourth semiconductor material pillar 44 is directly above third semiconductor material pillar 36, and in one embodiment as shown such third and fourth semiconductor material pillars are longitudinally coaxial.

Any suitable semiconductor material for pillars 18, 26, 36, and 44 may be used, such as doped polysilicon as an example. Source/drain regions 24, 22, 32, 30, 42, 40, 50 and 48 would be suitably doped to render such regions conductive. Channel regions 21, 29, 39 and 47 would be suitable doped to render such regions suitably semiconductive to operate as respective transistor channels as determined by gate voltage. Gates 20, 28, 38, and 46 are optionally shown as completely encircling their respective channel regions, and regardless may comprise any suitable conductive material(s).

In one embodiment and as shown, third semiconductor material pillar 36 is spaced aside first semiconductor material pillar 18, and in one embodiment fourth semiconductor material pillar 44 is spaced aside second semiconductor material pillar 26. In one embodiment, third semiconductor material pillar 36 and first semiconductor material pillar 18 extend along a common elevation relative one another (i.e., there is at least some elevational overlap of pillars 36 and 18 relative one another in some horizontal plane through both of pillars 36 and 18). In one embodiment, third semiconductor material pillar 36 and first semiconductor material pillar 18 are elevationally coincident relative one another (i.e., such have the same elevational thickness and extend along a same common elevation, e.g., elevation $E_1$ in FIG. 2). In one embodiment, fourth semiconductor material pillar 44 and second semiconductor material pillar 26 extend along a common elevation relative one another, and in one embodiment as shown are elevationally coincident relative one another with respect to common elevational $E_2$. In one embodiment, the first, second, third, and fourth semiconductor material pillars extend vertically or within 10° of vertical.

Construction 12 comprises a lower voltage activation line 52 electrically coupled to each of top source/drain region 22 of first transistor nT1 and bottom source/drain region 32 of second transistor nT2. In this document, regions/materials/components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions/materials/components. In contrast, when regions/materials/components are referred to as being "directly electrically coupled", no intervening electronic component (e.g., no diode, transistor, resistor, transducer, switch, fuse, etc.) is between the directly electrically coupled regions/materials/components. Construction 12 also includes a higher voltage activation line 54 electrically coupled to each of top source/drain region 40 of third transistor pT3 and bottom source/drain region 50 of fourth transistor pT4. In the context of this document "lower" and "higher" with respect to "lower voltage" and "higher voltage" are only with respect to relative voltages of activation lines 52 and 54 with respect to one another and not with respect to relative elevational position. By way of example only, integrated circuitry construction would be provided as would be recognized by people of skill in the art for providing such voltages, with an example lower voltage being from −0.5V to 1.5V and an example higher voltage range being from 0.6V to 1.5V.

In one embodiment and as shown, lower voltage activation line 52 is elevationally between top source/drain region 22 of first transistor nT1 and bottom source/drain region 32 of second transistor nT2, and in one embodiment top source/drain region 22 is directly against a bottom surface 56 of lower voltage activation line 52 and bottom source/drain region 32 is directly against a top surface 58 of lower voltage activation line 52. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another. In one embodiment, higher voltage activation line 54 is elevationally between top source/drain region 40 of third transistor pT3 and bottom source/drain region 50 of fourth transistor pT4, and in one embodiment top source/drain region 40 is directly against a bottom surface 60 of higher voltage activation line 54 and bottom source/drain region 50 is directly against a top surface 62 of higher voltage activation line 54.

Construction 12 also comprises a first lower conductor 66 directly electrically coupling gates 20 and 38 of first transistor nT1 and third transistor pT3, respectively, together. Construction 12 includes a second upper conductor 68 directly electrically coupling top source/drain regions 30 and 48 of second transistor nT2 and third transistor pT4, respectively, together. First conductor 66 is directly electrically coupled to second upper conductor 68 (e.g., through conductive material of gate 20, a conductor 69, and a conductor 70). A third lower conductor 72 directly electrically couples bottom source/drain regions 24 and 42 of first transistor nT1 and third transistor pT3, respectively, together. Construction 12 comprises a fourth upper conductor 74 directly electrically coupling gates 28 and 46 of second transistor nT2 and fourth transistor pT4, respectively, together. Third conductor 72 is directly electrically coupled to fourth conductor 74 (e.g., through a conductor 76, a conductor 77, and conductive material of gate 46). In one embodiment, first lower conductor 66 is above third lower conductor 72, and in one embodiment second upper conductor 68 is above fourth upper conductor 74.

In one embodiment, first conductor 66, second conductor 68, third conductor 72, and fourth conductor 74 comprise metal material. In the context of this document, "metal material" is any one or combination of an elemental metal, a mixture or an alloy of two or more elemental metals, and any conductive metal compound. In one embodiment, first lower conductor 69 is directly electrically coupled to second upper conductor 68 at least in part by a pillar comprising conductively-doped semiconductor material (e.g., polysilicon), for example the depicted pillar 70. In one embodiment, third lower conductor 72 is directly electrically coupled to fourth upper conductor 74 at least in part by a pillar comprising conductively-doped semiconductor material, for example as shown by conductor 76 which may be conductively-doped polysilicon. An example conductor 63 (e.g., conductively-doped polysilicon) and a conductor 65 (e.g., metal material) are shown by way of example extending elevationally upward from conductor 77.

In one embodiment the first, second, third, and fourth conductors comprise horizontally-extending metal material, with the first lower conductor being directly electrically coupled to the second upper conductor at least in part by a vertically-extending pillar comprising conductively-doped semiconductor material (e.g., 70), and the third lower conductor is directly electrically coupled to the fourth upper conductor at least in part by another vertically-extending pillar comprising conductively-doped semiconductor material (e.g., 76).

Solid dielectric material (not shown) may surround the various parts of the FIGS. 2-5 construction.

Figure 6:
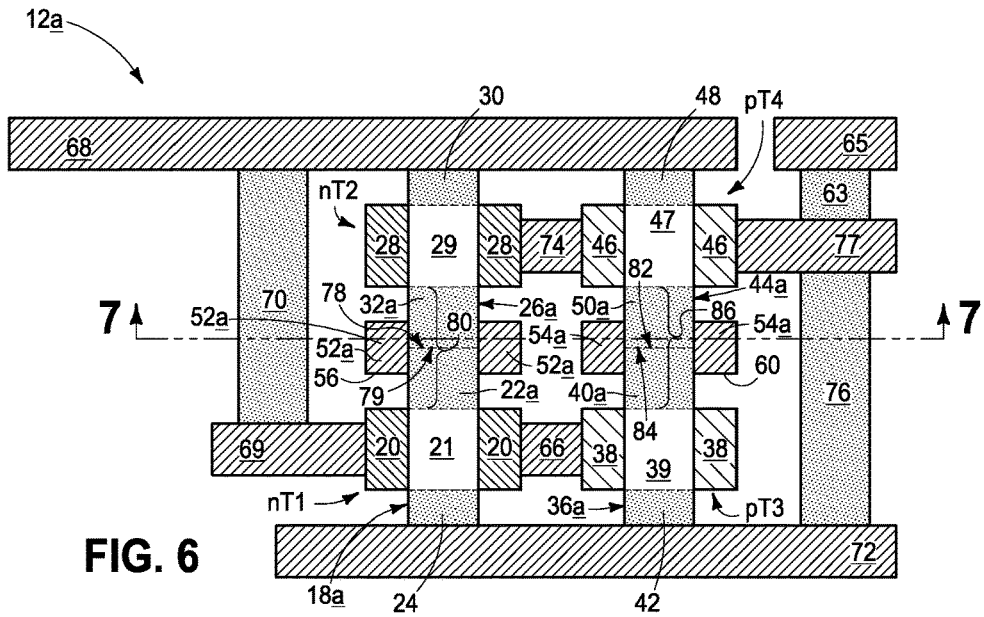
FIG. 6 is a diagrammatic vertical section view of a sense amplifier construction in accordance with part of the FIG. 1 schematic and an embodiment of the invention.
Figure 7:
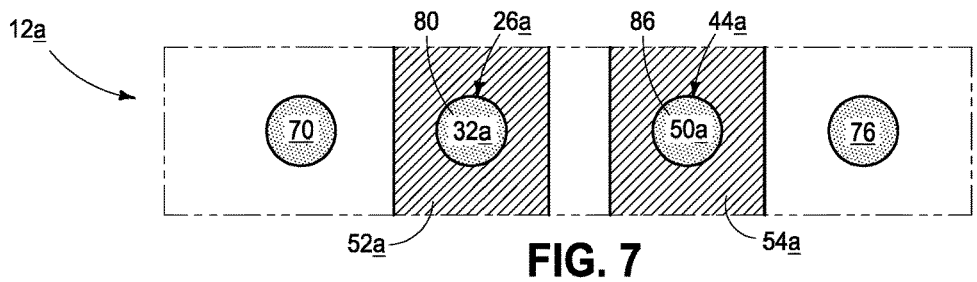
FIG. 7 is a cross-sectional view taken through line 7-7 in FIG. 6.

In the above example embodiments, lower voltage activation line 52 is elevationally between the top source/drain region of the first transistor and the bottom source/drain region of the second transistor. Additionally, higher voltage activation line 54 is elevationally between the top source/drain region of the third transistor and the bottom source/drain region of the fourth transistor. An alternate example sense amplifier construction 12a is shown and described with respect to FIGS. 6 and 7 where neither of such is present. Like numerals from the above-described embodiments have been used where appropriate, with some construction differences being indicated with the suffix "a" or with different numerals. Second semiconductor material pillar 26a is directly above first semiconductor material pillar 18a, with a top 78 of first semiconductor material pillar 18a being directly against a bottom 79 of second semiconductor material pillar 26a. Top source/drain region 22a of first transistor nT1 and bottom source/drain region 32a of second transistor nT2 comprise a common same shared source/drain region 80 of first transistor nT1 and second transistor nT2. Lower voltage activation line 52a is directly against a side surface of shared source/drain region 80 of first transistor nT1 and second transistor nT2, and is optionally shown as completely encircling shared source/drain region 80.

Analogously, fourth semiconductor material pillar 44a is directly above third semiconductor material pillar 36a. A top 82 of third semiconductor material pillar 36a is directly against a bottom 84 of fourth semiconductor material pillar 44a. Top source/drain region 40a of third transistor pT3 and bottom source/drain region 50a of fourth transistor pT4 comprise a common same shared source/drain region 86 of third transistor pT3 and fourth transistor pT4. Higher voltage activation line 54a is directly against a side surface of shared source/drain region 86 of third transistor pT3 and fourth transistor pT4, and is optionally shown as completely encircling shared source/drain region 86. Alternate constructions are contemplated. For example and by way of example only, one of transistor pairs nT1/nT2 and pT3/pT4 could have the construction of FIGS. 2 and 3 and the other have the construction of FIGS. 6 and 7. Any other attribute(s) or aspect(s) as shown and/or described above may be used.

Referring to FIG. 1, example circuitry peripheral to the sense amplifier 12 schematic is shown that might be implemented in memory circuitry having comparative bit lines, for example bit lines BL-T (true) and BL-C (compliment) in a folded bit line architecture. A column select transistor CS connects with each BL-T and BL-C and extends to read/write control logic circuitry R/WCL. Example equilibrate circuitry 87 comprising equilibrate transistors 88 is also shown. By way of examples, higher voltage activation line 54 connects to $V_{DD}$ through a transistor 89 and lower voltage activation line 52 connects to $V_{ss}$ through a transistor 90, and lines 52 and 54 may be global signal lines. However and regardless, sense amplifier construction 12 might be used with respect to other memory circuitry and/or non-memory circuitry.

Figure 8:
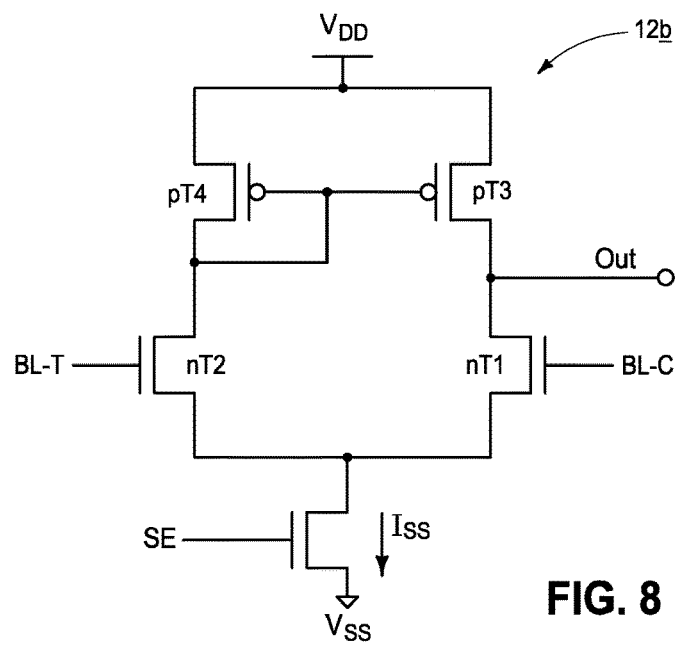
FIG. 8 is a non-structural diagrammatic schematic of a sense amplifier construction in accordance with an embodiment of the invention.
Figure 9:
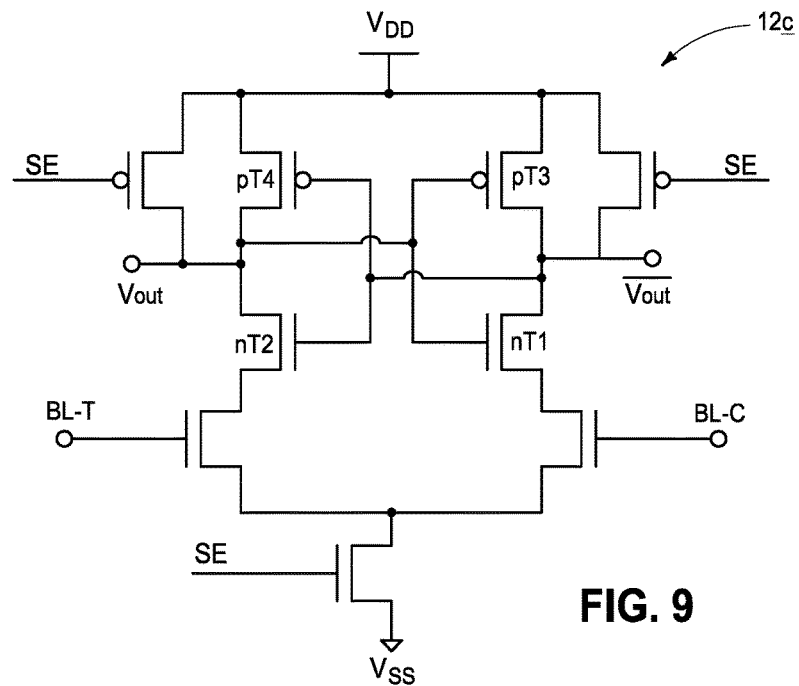
FIG. 9 is a non-structural diagrammatic schematic of a sense amplifier construction in accordance with an embodiment of the invention.

The above-described embodiments were with respect to an example latched voltage sense amplifier construction. However, other latched or non-latch-based sense amplifier constructions may be used, for example as shown with respect to a sense amplifier 12b in FIG. 8 and a sense amplifier 12c in FIG. 9. Like numerals from the above-described embodiments have been used where appropriate, with some differences being indicated with the suffix "b" and "c", respectively, and with different letter designations. FIG. 9 shows an example latch-based sense amplifier that is a current controlled latched sense amplifier, while FIG. 8 shows a non-latch-based sense amplifier that is a differential voltage sense amplifier. One or more of such constructions may have alternate embodiment first, second, third, and/or fourth conductors as-described above, or may not include all such conductors, and such may be differently constructed and/or elevationally arranged relative one another to achieve the respective schematic electrically coupling interconnects. Any other attribute(s) or aspect(s) as shown and/or described above may be used in the embodiments of FIGS. 8 and 9.

Other sense amplifier constructions may be used other than those shown and described with reference to the schematics of FIGS. 1, 8, and 9, and regardless of whether existing or yet-to-be-developed. Regardless, and in one embodiment, a sense amplifier construction comprises a first n-type transistor and a second n-type transistor above the first n-type transistor. Also included are a third p-type transistor and a fourth p-type transistor above the third p-type transistor. A lower voltage activation line is electrically coupled to n-type source/drain regions that are elevationally between respective gates of the first and second n-type transistors. A higher voltage activation line is electrically coupled to p-type source/drain regions that are elevationally between respective gates of the third and fourth p-type transistors. In one embodiment, the first, second, third, and fourth transistors are each vertical or within 10° of vertical. In this document, "vertical" with respect to a field effect transistor is with reference to orientation of the transistor's channel length along which current flows in operation between the source/drain regions. Regardless, any other attribute(s) or aspect(s) as shown and/or described above may be used.

As stated, example sense amplifiers as described above may be used in any existing or yet-to-be-developed circuitry, including memory circuitry and non-memory circuitry. One example implementation of a sense amplifier 12 is schematically shown and described with respect to a two transistor, one capacitor (2T-1C), configuration 100 in FIG. 10. Equilibrate, column select, higher voltage and lower voltage activation line transistors from FIG. 1 are not shown for clarity in FIG. 10. Although FIG. 10 is shown with respect to sense amplifier construction 12, other sense amplifier constructions as referred to herein might alternately or additionally be used.

An example 2T-1C memory cell 202 has two transistors T1 and T2 and a capacitor CAP. A source/drain region of T1 connects with a first node of capacitor CAP, and the other source/drain region of T1 connects with a first comparative bit line (e.g., BL-T). A gate of T1 connects with a word line WL. A source/drain region of T2 connects with a second node of capacitor CAP, and the other source/drain region of T2 connects with a second comparative bit line (e.g., BL-C). A gate of T2 connects with word line WL. Comparative bit lines BL-T and BL-C extend to conductors 65 and 68, respectively, which may compare electrical properties (e.g., voltage) of the two bit lines to ascertain a memory state of memory cell 202. Any other attribute(s) or aspect(s) as shown and/or described above may be used.

Figure 10:
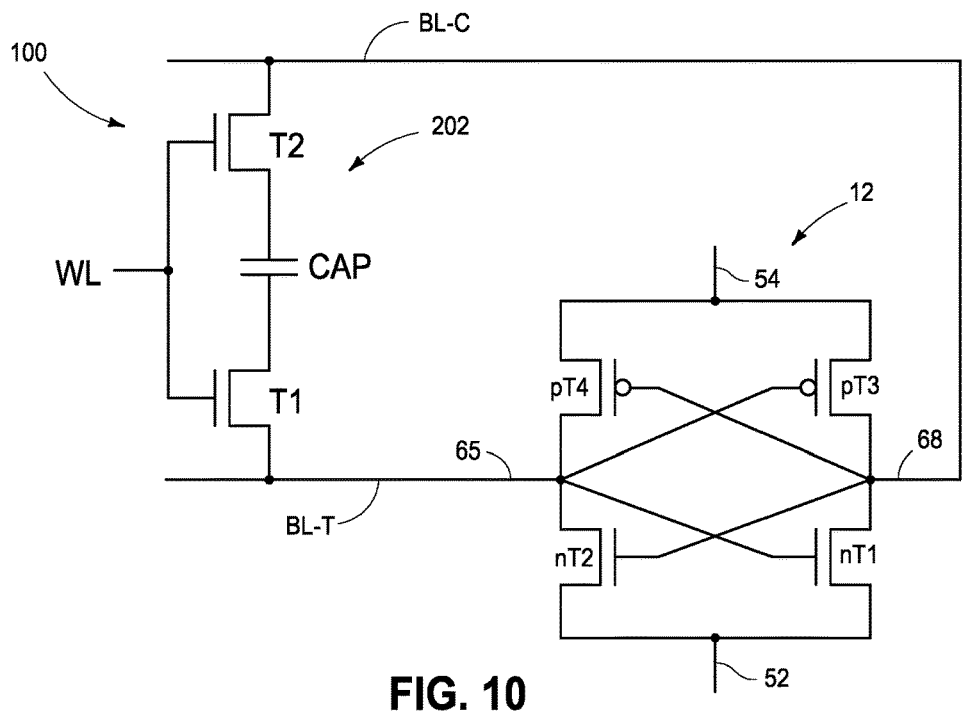
FIG. 10 is a non-structural diagrammatic schematic of a sense amplifier construction and associated circuitry in accordance with an embodiment of the invention.
Figure 11:
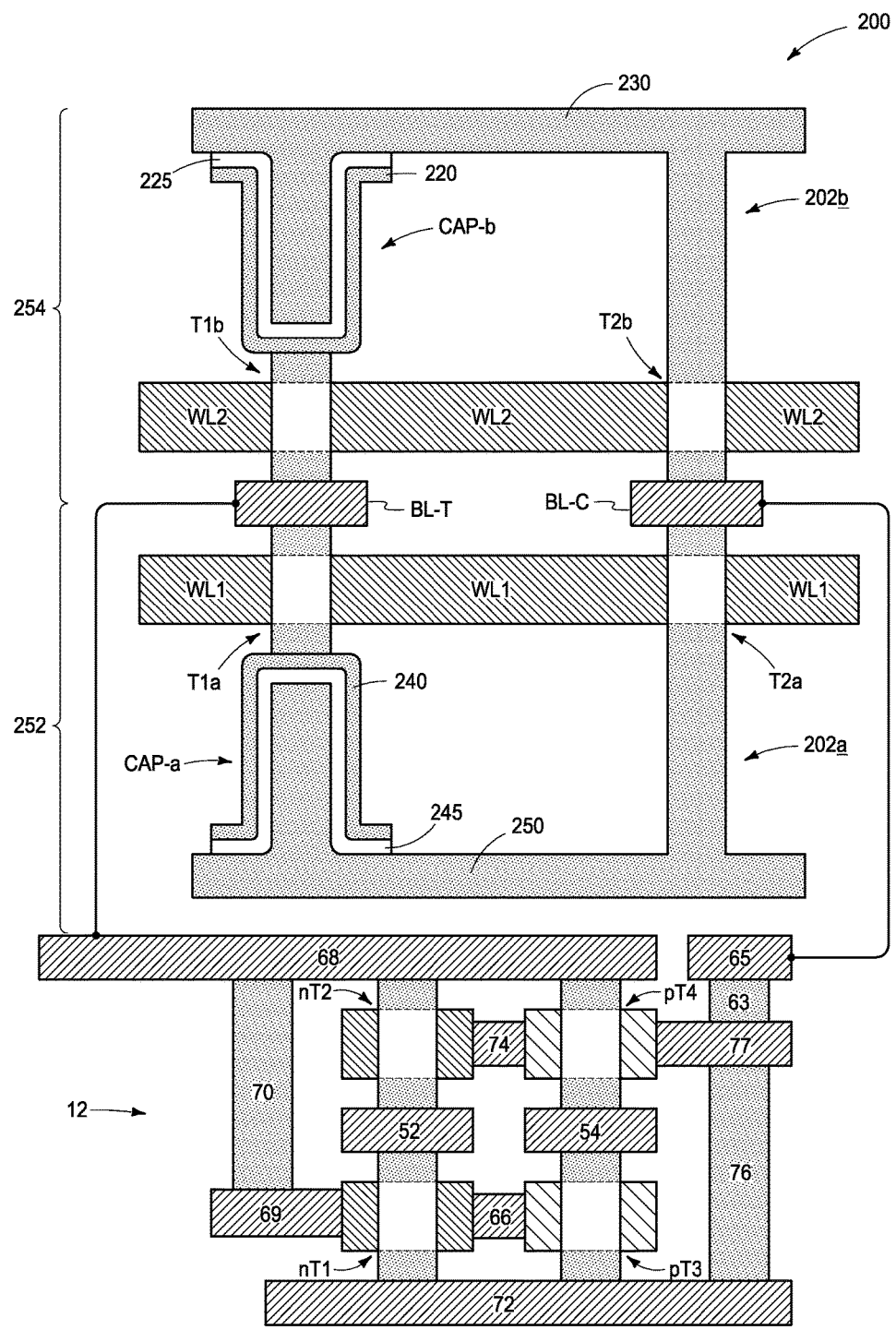
FIG. 11 is a diagrammatic hybrid vertical section and schematic view of a construction incorporating a sense amplifier construction in accordance with the FIG. 10 schematic and an embodiment of the invention.

FIG. 11 shows an example 2T-1C memory cell construction 200 of the FIG. 10 schematic having a second tier 254 over a first tier 252 and inverted such that comparative bit lines BL-T and BL-C may be shared between the tiers. Sense amplifier construction 12 is shown below tiers 254 and 252, although such could be somewhere above or aside tiers 252 and 254. First tier 252 comprises memory cell 202a and second tier 254 comprises memory cell 202b. Memory cell 202b comprises first and second transistors T1b and T2b, and memory cell 202a comprises first and second transistors T1a and T2a. Again, gate insulator (not shown for consistency among the Figures) would be between the respective gates and channel regions. Memory cells 202b and 202a comprise a capacitor CAP-b and CAP-a, respectively. CAP-b comprises conductive capacitor electrodes 220 and 230 separated by capacitor insulator 225. CAP-a comprises conductive capacitor electrodes 240 and 250 separated by capacitor insulator 245. A word line WL1 extends across and is part of memory cell 202a. A word line WL2 extends across and is part of memory cell 202b. Any other attribute(s) or aspect(s) as shown and/or described above may be used.

Figure 12:
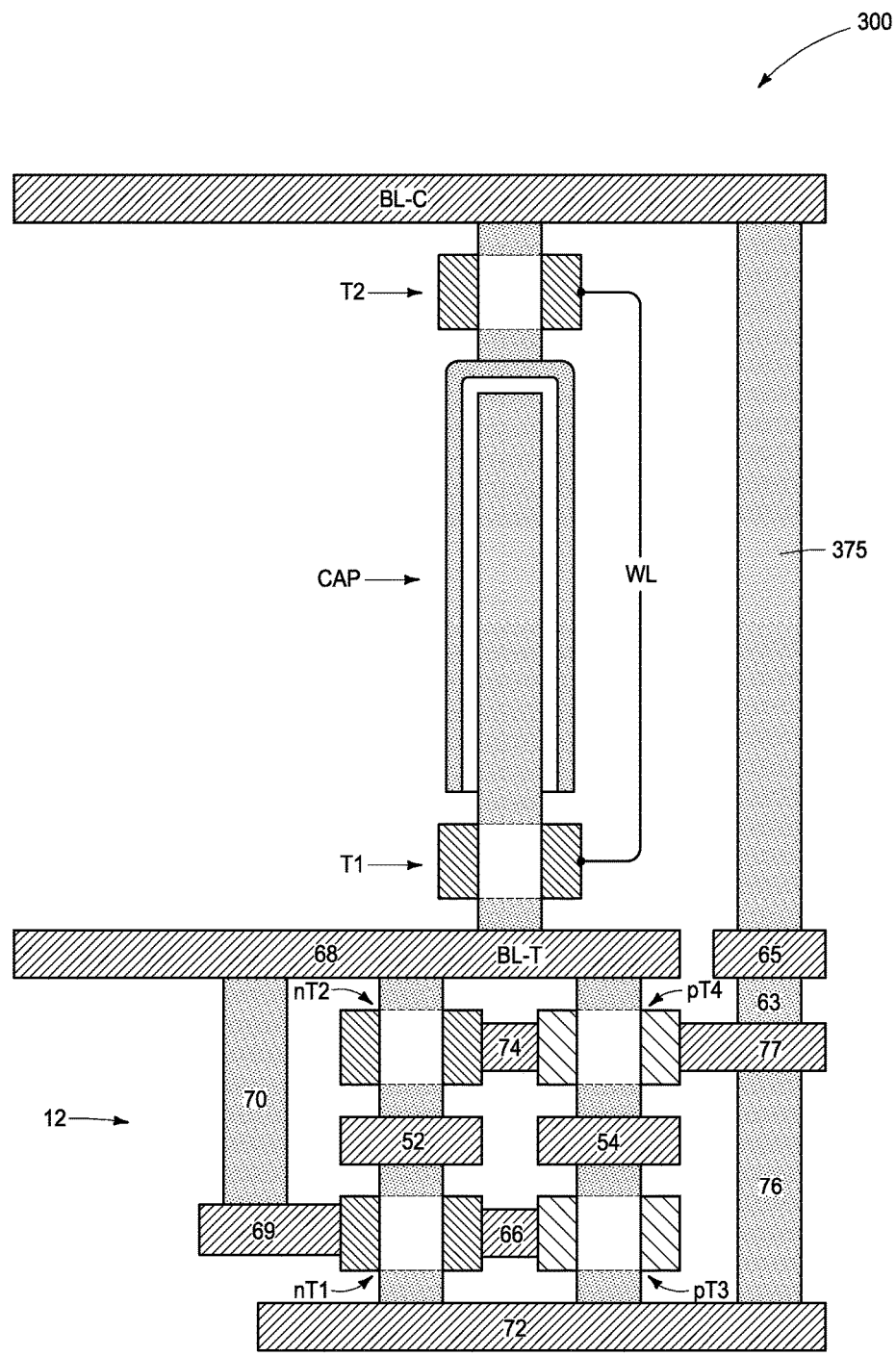
FIG. 12 is a diagrammatic hybrid vertical section and schematic view of a construction incorporating a sense amplifier construction in accordance with the FIG. 10 schematic and an embodiment of the invention.

FIG. 12 shows another example 2T-1C memory cell construction 300 of the FIG. 10 schematic. Transistors T1 and T2 are vertically offset relative one another (e.g., and coaxial as shown), and capacitor CAP is provided vertically between such transistors. T1 and T2 are shown electrically coupled schematically by word line WL. Conductor 65 is shown electrically coupled to BL-C by a conductor 375. Any other attribute(s) or aspect(s) as shown and/or described above may be used.

CONCLUSION

In some embodiments, a sense amplifier construction comprises a first n-type transistor and a second n-type transistor above the first n-type transistor. A third p-type transistor is included and a fourth p-type transistor is above the third p-type transistor. A lower voltage activation line is electrically coupled to n-type source/drain regions that are elevationally between respective gates of the first and second n-type transistors. A higher voltage activation line is electrically coupled to p-type source/drain regions that are elevationally between respective gates of the third and fourth p-type transistors.

In some embodiments, a sense amplifier construction comprises a first n-type transistor and a second n-type transistor extending elevationally outward relative to the first n-type transistor. The first transistor comprises a first semiconductor material pillar extending along a first gate and comprises a first channel region elevationally between first transistor top and bottom n-type source/drain regions. The second transistor comprises a second semiconductor material pillar extending along a second gate and comprises a second channel region elevationally between second transistor top and bottom n-type source/drain regions. A third p-type transistor is included and a fourth p-type transistor extends elevationally outward relative to the third p-type transistor. The third transistor comprises a third semiconductor material pillar extending along a third gate and comprises a third channel region elevationally between third transistor top and bottom p-type source/drain regions. The fourth transistor comprises a fourth semiconductor material pillar extending along a fourth gate and comprises a fourth channel region elevationally between fourth transistor top and bottom p-type source/drain regions. A lower voltage activation line is electrically coupled to each of the top source/drain region of the first transistor and the bottom source/drain region of the second transistor. A higher voltage activation line is electrically coupled to each of the top source/drain region of the third transistor and the bottom source/drain region of the fourth transistor.

In some embodiments, a latch-based sense amplifier construction comprises a first n-type transistor and a second n-type transistor above the first n-type transistor. A lower voltage activation line is electrically coupled to n-type source/drain regions of the first and second n-type transistors that are elevationally between respective gates of the first and second n-type transistors. A third p-type transistor is aside the first n-type transistor. A fourth p-type transistor is above the third p-type transistor and aside the second n-type transistor. A higher voltage activation line is electrically coupled to p-type source/drain regions of the third and fourth p-type transistors that are elevationally between respective gates of the third and fourth p-type transistors. A first lower conductor directly electrically couples gates of the first and third transistors together. A second upper conductor directly electrically couples top source/drain regions of the second and fourth transistors together. The first conductor is directly electrically coupled to the second conductor. A third lower conductor directly electrically couples bottom source/drain regions of the first and third transistors together. A fourth upper conductor directly electrically couples gates of the second and fourth transistors together. The third conductor is directly electrically coupled to the fourth conductor.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A sense amplifier construction comprising:
a first n-type transistor and a second n-type transistor extending elevationally outward relative to be vertically offset from the first n-type transistor, the first transistor comprising a first semiconductor material pillar extending along a first gate and comprising a first channel region elevationally between first transistor top and bottom n-type source/drain regions, the second transistor comprising a second semiconductor material pillar extending along a second gate and comprising a second channel region elevationally between second transistor top and bottom n-type source/drain regions;
a third p-type transistor and a fourth p-type transistor extending elevationally outward relative to the third p-type transistor, the third transistor comprising a third semiconductor material pillar extending along a third gate and comprising a third channel region elevationally between third transistor top and bottom p-type source/drain regions, the fourth transistor comprising a fourth semiconductor material pillar extending along a fourth gate and comprising a fourth channel region elevationally between fourth transistor top and bottom p-type source/drain regions;
a lower voltage activation line electrically coupled to each of the top source/drain region of the first transistor and the bottom source/drain region of the second transistor; and
a higher voltage activation line electrically coupled to each of the top source/drain region of the third transistor and the bottom source/drain region of the fourth transistor.

2. The sense amplifier construction of claim 1 wherein the second semiconductor material pillar is vertically offset directly above the first semiconductor material pillar.

3. The sense amplifier construction of claim 1 wherein the lower voltage activation line is elevationally between the top source/drain region of the first transistor and the bottom source/drain region of the second transistor.

4. The sense amplifier construction of claim 1 wherein,
the second semiconductor material pillar is vertically offset directly above the first semiconductor material pillar;
a top of the first semiconductor material pillar is directly against a bottom of the second semiconductor material pillar and the top source/drain region of the first transistor and the bottom source/drain region of the second transistor comprise a common same shared source/drain region of the first and second transistors; and
the lower voltage activation line is directly against a side surface of the shared source/drain region of the first and second transistors.

5. The sense amplifier construction of claim 1 wherein the fourth semiconductor material pillar is vertically offset directly above the first semiconductor material pillar.

6. The sense amplifier construction of claim 1 wherein the higher voltage activation line is elevationally between the top source/drain region of the third transistor and the bottom source/drain region of the fourth transistor.

7. The sense amplifier construction of claim 6 wherein the top source/drain region of the third transistor is directly against a bottom surface of the higher voltage activation line and the bottom source/drain region of the fourth transistor is directly against a top surface of the higher voltage activation line.

8. The sense amplifier construction of claim 1 wherein,
the fourth semiconductor material pillar is vertically offset directly above the third semiconductor material pillar;
a top of the third semiconductor material pillar is directly against a bottom of the fourth semiconductor material pillar and the top source/drain region of the third transistor and the bottom source/drain region of the fourth transistor comprise a common same shared source/drain region of the third and fourth transistors; and
the higher voltage activation line is directly against a side surface of the shared source/drain region of the third and fourth transistors.

9. The sense amplifier construction of claim 1 wherein the third semiconductor material pillar is spaced aside the first semiconductor material pillar.

10. The sense amplifier construction of claim 1 wherein the fourth semiconductor material pillar is spaced aside the second semiconductor material pillar.

11. The sense amplifier construction of claim 1 wherein the first, second, third, and fourth semiconductor material pillars extend vertically or within 10° of vertical.

12. The sense amplifier construction of claim 11 wherein the first, second, third, and fourth semiconductor material pillars extend vertically; the first and third pillars being spaced aside and elevationally coincident relative one another; the third and fourth pillars being spaced aside and elevationally coincident relative one another.

13. A latch-based sense amplifier construction comprising:
a first n-type transistor and a second n-type transistor vertically offset above the first n-type transistor;
a lower voltage activation line electrically coupled to n-type source/drain regions of the first and second n-type transistors that are elevationally between respective gates of the first and second n-type transistors;
a third p-type transistor aside the first n-type transistor, a fourth p-type transistor vertically offset above the third p-type transistor and aside the second n-type transistor;
a higher voltage activation line electrically coupled to p-type source/drain regions of the third and fourth p-type transistors that are elevationally between respective gates of the third and fourth p-type transistors;
a first lower conductor directly electrically coupling gates of the first and third transistors together;
a second upper conductor directly electrically coupling top source/drain regions of the second and fourth transistors together, the first conductor being directly electrically coupled to the second conductor;
a third lower conductor directly electrically coupling bottom source/drain regions of the first and third transistors together; and
a fourth upper conductor directly electrically coupling gates of the second and fourth transistors together, the third conductor being directly electrically coupled to the fourth conductor.

14. The latch-based sense amplifier construction of claim 13 wherein the first, second, third, and fourth transistors are each vertical or within 10° of vertical.

15. The latch-based sense amplifier construction of claim 13 wherein the first lower conductor is vertically offset above the third lower conductor.

16. The latch-based sense amplifier construction of claim 13 wherein the second upper conductor is vertically offset above the fourth upper conductor.

17. The latch-based sense amplifier construction of claim 13 wherein the third lower conductor is directly electrically coupled to the fourth upper conductor at least in part by a pillar comprising conductively-doped semiconductor material.

18. The latch-based sense amplifier construction of claim 13 wherein the first, second, third, and fourth conductors comprise horizontally-extending metal material; the first lower conductor being directly electrically coupled to the second upper conductor at least in part by a vertically-extending pillar comprising conductively-doped semiconductor material; and the third lower conductor being directly electrically coupled to the fourth upper conductor at least in part by another vertically-extending pillar comprising conductively-doped semiconductor material.

* * * * *